United States Patent
Davis (10) Patent No.: US 9,695,944 B2
(45) Date of Patent: Jul. 4, 2017

(54) ELECTRICAL CORROSION RESISTANT MECHANICAL SEAL

(71) Applicant: FLOWSERVE MANAGEMENT COMPANY, Irving, TX (US)

(72) Inventor: John Davis, Temecula, CA (US)

(73) Assignee: Flowserve Management Company, Irving, TX (US)

(*) Notice: Subject to any disclaimer, the term of this patent is extended or adjusted under 35 U.S.C. 154(b) by 17 days.

(21) Appl. No.: 14/560,446

(22) Filed: Dec. 4, 2014

(65) Prior Publication Data

US 2015/0176712 A1  Jun. 25, 2015

Related U.S. Application Data

(60) Provisional application No. 61/920,076, filed on Dec. 23, 2013.

(51) Int. Cl.
| | |
|---|---|
| *F16J 15/34* | (2006.01) |
| *C23C 16/32* | (2006.01) |
| *C23C 16/06* | (2006.01) |

(52) U.S. Cl.
CPC ........ *F16J 15/3496* (2013.01); *C23C 16/06* (2013.01); *C23C 16/32* (2013.01); *F16J 15/3412* (2013.01); *F16J 15/34* (2013.01); *F16J 15/3424* (2013.01)

(58) Field of Classification Search
CPC ...... F16J 15/34; F16J 15/3404; F16J 15/3412; F16J 15/3424; F16J 15/3496
See application file for complete search history.

(56) References Cited

U.S. PATENT DOCUMENTS

| | | | |
|---|---|---|---|
| 3,306,764 A | 2/1967 | Lewis et al. | |
| 3,634,116 A * | 1/1972 | Woerner | C04B 41/009 423/346 |
| 4,668,583 A | 5/1987 | Olander | |

(Continued)

FOREIGN PATENT DOCUMENTS

WO  WO 2004-009515 A1  1/2004

OTHER PUBLICATIONS

"The Tantaline® Surface Alloy Process as an Alternative to Solid Corrosion Resistant Alloys", Flowserve, Aug. 2011.*

(Continued)

*Primary Examiner* — Nicholas L Foster
(74) *Attorney, Agent, or Firm* — Miller Canfield Paddock and Stone; Mark L Maki (57) ABSTRACT

An improved mechanical face seal is provided which includes a pair of relatively rotatable seal rings having opposing seal faces. At least one of the seal faces and preferably the silicon carbide seal ring includes a tantalum coating over the seal face. The coating is formed such that the exposed seal face surface is formed of tantalum with a preferred thickness, and the substrate is the silicon carbide seal ring material. Between the silicon carbide substrate and exposed tantalum coating layer, an intermediate transformation layer of tantalum carbide is formed to enhance bonding of the substrate and coating layer. Preferably, the tantalum carbide layer is formed during the coating process wherein the tantalum is applied by chemical vapor deposition and the tantalum reacts with the silicon carbide to form the tantalum carbide at the interface between the tantalum coating layer and the seal ring substrate.

14 Claims, 4 Drawing Sheets

(56) References Cited

U.S. PATENT DOCUMENTS

| | | | | |
|---|---|---|---|---|
| 4,686,156 | A | * | 8/1987 | Baldoni, II ............ C04B 41/009 |
| | | | | 428/469 |
| 4,732,396 | A | | 3/1988 | Brigham et al. |
| 4,934,254 | A | | 6/1990 | Clark et al. |
| 5,468,002 | A | * | 11/1995 | Wasser .................. F16J 15/3404 |
| | | | | 277/361 |
| 6,200,524 | B1 | | 3/2001 | Griskin et al. |
| 6,338,906 | B1 | | 1/2002 | Ritland et al. |
| 6,946,096 | B2 | | 9/2005 | Giesler et al. |
| 7,226,671 | B2 | | 6/2007 | Giesler et al. |
| 7,799,388 | B2 | | 9/2010 | Sabouni et al. |
| 8,216,667 | B2 | | 7/2012 | Fujiwara et al. |
| 8,250,757 | B2 | | 8/2012 | Young |
| 2002/0136835 | A1 | * | 9/2002 | Li .......................... C04B 41/009 |
| | | | | 427/376.2 |
| 2005/0112381 | A1 | * | 5/2005 | Raybould ................ C04B 41/52 |
| | | | | 428/446 |
| 2007/0228664 | A1 | * | 10/2007 | Anand .................. F16J 15/3412 |
| | | | | 277/399 |
| 2009/0060408 | A1 | | 3/2009 | Nagasaka et al. |
| 2011/0048810 | A1 | * | 3/2011 | Lin .......................... E21B 10/25 |
| | | | | 175/371 |
| 2011/0169225 | A1 | * | 7/2011 | Winkler ............... F16J 15/3404 |
| | | | | 277/408 |
| 2011/0200280 | A1 | | 8/2011 | Gruenaug |
| 2011/0307068 | A1 | * | 12/2011 | Hauert ................... A61L 27/303 |
| | | | | 623/23.6 |
| 2012/0040172 | A1 | * | 2/2012 | Fujiwara ............... C04B 41/009 |
| | | | | 428/306.6 |
| 2013/0209777 | A1 | | 8/2013 | Nagasaka et al. |
| 2015/0321966 | A1 | * | 11/2015 | Shinohara ............. C04B 41/009 |
| | | | | 428/172 |
| 2016/0108512 | A1 | * | 4/2016 | Medvedovski ......... C23C 10/36 |
| | | | | 428/662 |

OTHER PUBLICATIONS

"The Tantaline Technology and Performance", www.tantaline.com/Technology-13.aspx, Aug. 29, 2013, accessed Feb. 17, 2017 via https://web.archive.org/web/20130829165044/http://www.tantaline.com/Technology-13.aspx.*

The International Search Report and Written Opinion of the International Searching Authority for PCT/US2014/068554, date completed Feb. 18, 2015, date mailed Feb. 25, 2015.

NASA Scientific and Technical Publications, "Corrosion of Metals in Deionized Water at 38° C. (100° F.)," by Barbara A. Johnson Lewis Research Center, Cleveland, Ohio, May 1969.

"Advanced Mechanical Seal Face Materials Increase Boiler Feed Water Pump Reliability and Availability in ultrapure water", by Andreas Krestchmer, EagleBurgmann, Germany, presented at least as early as Apr. 24, 2013.

* cited by examiner

ELECTRICAL CORROSION RESISTANT MECHANICAL SEAL

CROSS REFERENCE TO RELATED APPLICATIONS

This application asserts priority from provisional application 61/920,076, filed on Dec. 23, 2013, which is incorporated herein by reference.

FIELD OF THE INVENTION

The invention relates to a mechanical seal arrangement, and more particularly relates to a seal face having a tantalum coating to form an electrical corrosion resistant mechanical seal ring.

BACKGROUND OF THE INVENTION

Mechanical face seals are used on various types of machines and equipment, such as pumps, compressors and gear boxes, which have rotating shafts and a sealing chamber adjacent the shaft wherein a fluid in the sealing chamber is prevented from leaking along the shaft. Such mechanical seals include a pair of adjacent seal rings having opposing seal faces which define a sealing region therebetween. One of these seal rings typically is mounted on the shaft so as to rotate therewith while the other seal ring is non-rotatably mounted on a seal housing. The fluid being sealed is disposed on one edge of the sealing region, wherein the opposing seal faces at least reduce leakage of the sealed fluid across the sealing region.

Most liquid seals operate with the seal faces rotating in contact. However, due to asperities in the seal faces, some leakage may occur. In gas seals, the seal faces often are provided with grooves or recesses to generate hydrodynamic lifting forces. In this regard, the seal faces typically separate a small distance wherein a thin film of fluid forms between the seal faces to lubricate the seal faces and reduce wear therebetween. Additionally, the grooves or recesses may pump the fluid film toward the fluid being sealed to reduce leakage of the sealed fluid.

With respect to specific constructions of mechanical seals, one representative mechanical seal is disclosed in U.S. Pat. No. 6,446,976 (Key et al), the disclosure of which is incorporated herein in its entirety by reference. In this mechanical seal, one of the seal faces includes a plurality of concentric shallow annular grooves which preferably are disposed near the seal ring diameter that is farthest away from the fluid being sealed. In general, the basic construction of mechanical seals and the use of relatively rotatable seal rings are well known, and a detailed discussion of such mechanical seals is not required herein.

More particularly, dry running lift-off face seals, also called fluid film, gap, or non-contacting face seals, have found application in both gas and liquid sealing applications in compressors and pumps. The fluid film between the seal faces allows the seal to operate with minimum heat generation and no wear.

Dry running lift-off face seals utilize a variety of shapes of shallow grooves to create lift between the seal faces, allowing the faces to run without contact. Existing examples include spiral grooves, radially tapered waves, and T-grooves. These various grooves are designed to provide a varying combination of hydrostatic and hydrodynamic load support to achieve separation of the seal faces by a small gap. Hydrostatic load support is created through the manipulation of the fluid pressures acting between the seal faces, and is not dependant on motion between the seal faces to create lift. Hydrodynamic load support is created through the active compression of the fluid between the seal faces due to movement of the fluid from a wide gap to a narrower gap, and requires relative motion between the seal faces to create lift. This relative motion typically occurs during shaft rotation.

The geometry of the shallow grooves determines the amount of hydrostatic and hydrodynamic load support created at a given set of operating parameters. The total load support provided must be in equilibrium with the pressure and mechanical forces that act to close the seal faces at a specified operating gap.

One specific use for a mechanical seal is in boiler feed water applications in power plants, wherein the mechanical seal may be used to seal the rotating shaft of a pump by which the boiler feed water is being pumped. One unique problem associated with this application is that the feed water conditions generate electrical type corrosion of the seal faces. Such feed water may have a water chemistry which results in low conductivity, typically less than 2 uS (microsiemen). These conditions result in corrosion of the mechanical seal materials from which the seal rings are formed, which materials commonly can include silicon carbide (SiC) and tungsten carbide. The observed corrosion of the seal ring materials can be attributed to the electrically insulating properties associated with ultra-pure water chemistry. The damage commonly occurs at the outside diameter circumferential edges, drive slots, and high rotational velocity surfaces of the seal rings.

Several theories have been proposed as to this corrosion phenomenon such as erosion cavitation and Zeta spin potential with extensive laboratory testing conducted for verification. In attempting to overcome this problem, testing was conducted wherein grades of silicon carbide where altered to change electrical resistance but this did not prevent electrical corrosion in laboratory testing. In the alternative, chemical vapor deposition (CVD) coatings were investigated as a potential means of preventing corrosion in ultra-pure water applications. Various coatings were laboratory tested with marginal results due to application uniformity and localized pitting.

The objective of this invention is to provide an improved mechanical seal and seal ring construction which overcomes the problems associated with electrical corrosion in certain applications and particularly, ultra-pure water applications.

The invention relates to a unique seal ring construction for mechanical face seals, wherein the mechanical seal ring is coated over critical surfaces with a tantalum coating. The coating preferably is applied to at least some of the seal ring surfaces which are exposed to the process fluid so as to at least minimize electrical corrosion. The tantalum is applied in an inventive method such that the tantalum is applied to a carbide, and preferably silicon carbide (SiC) seal ring through chemical vapor deposition (CVD). The CVD process of applying the tantalum is conducted at an elevated temperature that adequately effects a reaction between the tantalum coating and the SiC substrate such that the tantalum and SiC form an intermediate transformation layer of tantalum carbide between an outer surface layer of tantalum and the SiC substrate. The transformation layer of tantalum carbide provides a strong bond between the tantalum layer and SiC substrate.

If desired, the outer tantalum layer on the seal face can then be machined, such as by laser machining, to form hydrodynamic face patterns at a depth less than the thickness of the tantalum coating layer. In this regard, it is preferred that the depth of the face pattern does not extend into the intermediate layer such that the interior surfaces of the face pattern are still comprised of tantalum.

In a first aspect, the invention relates to the structure of a seal ring formed of a SiC substrate, a tantalum carbide transformation layer, and a tantalum surface layer wherein the tantalum carbide forms during the application of the tantalum. In a second aspect, the invention relates to the method for forming this seal ring through a CVD process which supplies tantalum to the SiC substrate wherein an intermediate transformation layer forms during the CVD process.

Other objects and purposes of the invention, and variations thereof, will be apparent upon reading the following specification and inspecting the accompanying drawings.

Certain terminology will be used in the following description for convenience and reference only, and will not be limiting. For example, the words "upwardly", "downwardly", "rightwardly" and "leftwardly" will refer to directions in the drawings to which reference is made. The words "inwardly" and "outwardly" will refer to directions toward and away from, respectively, the geometric center of the arrangement and designated parts thereof. Said terminology will include the words specifically mentioned, derivatives thereof, and words of similar import.

DETAILED DESCRIPTION

Figure 1:
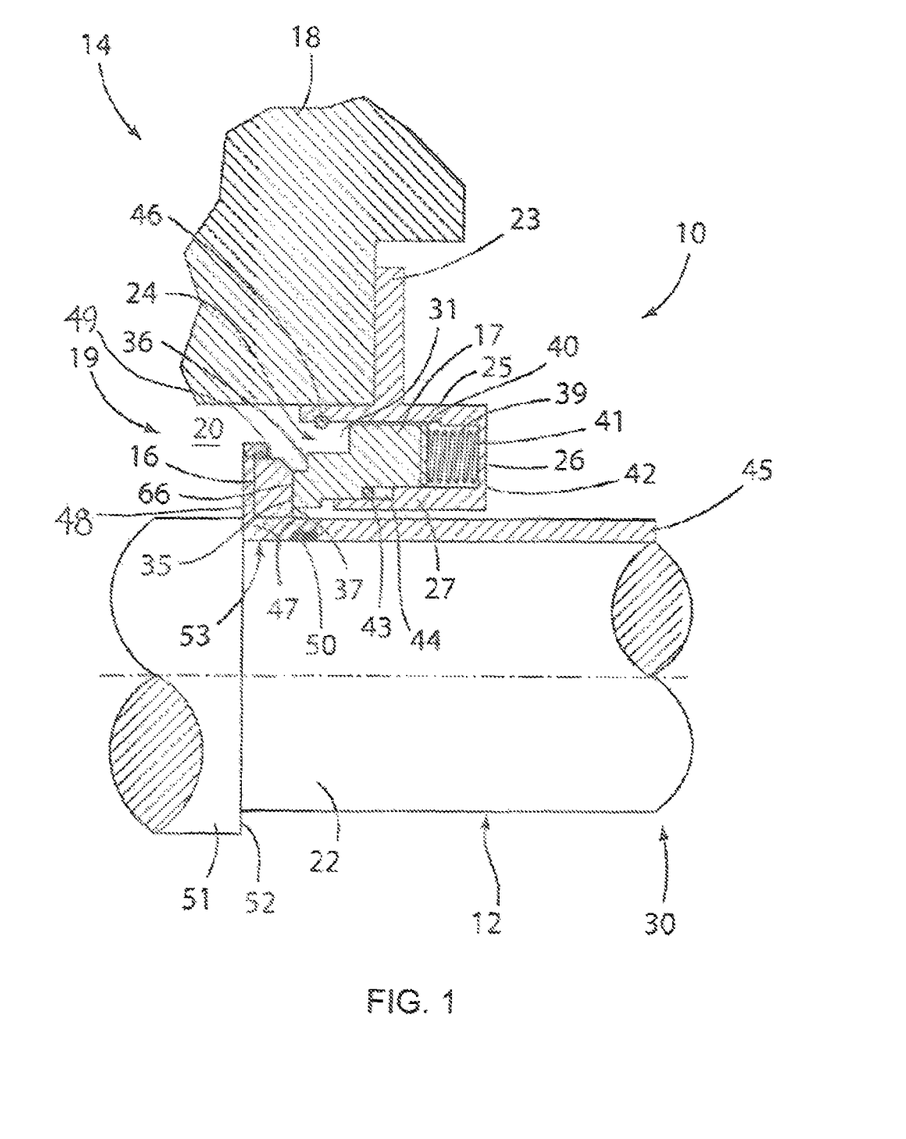
FIG. 1 is a cross-sectional view of a generalized pair of seal rings in a representative mechanical seal assembly.

Referring to FIG. 1, a mechanical face seal 10 is illustrated mounted on the rotatable shaft 12 of a machine 14. The mechanical seal 10 includes a pair of concentric seal rings 16 and 17 which operate as a rotor and a stator respectively and effectively prevent fluid leakage along the shaft 12. As will be described hereinafter, the rotating seal ring 16 preferably is provided with a tantalum coating which functions to resist corrosion of the seal ring surfaces when used in certain applications to resist electrical type corrosion. If desired, either of the seal rings 16 and 17 and most preferably, the silicon carbide seal ring 16 mates with a the seal ring 17 which may be carbon, and is provided with a shallow hydrodynamic face pattern.

FIG. 1 is a representative view of one configuration for an exemplary mechanical face seal 10. The illustrated pair of seal rings 16 and 17 is provided as a diagrammatic illustration of these types of seal rings. These seal rings 16 and 17 might be provided in a single seal configuration, or as part of a double seal configuration or even other seal configurations. The skilled artisan will appreciate that the tantalum coating of the invention can be used in various types of machines 14 or mechanical seals 10 as needs require.

The machine 14 as illustrated in FIG. 1 includes a housing 18 which defines a seal chamber 19 therein in which seal chamber 19 a fluid or process fluid 20 being sealed is confined. The machine 14 further includes a rotating shaft 12 to which the mechanical seal 10 is mounted. The shaft 12 drives components such as a pump or other types of rotating equipment. The invention is not limited to a specific type of machine 14 or seal ring configuration, but is directed to the formation of a seal ring with a tantalum coating as described herein.

The shaft 12 has a conventional circular cross section defined by an outer circumferential shaft surface 22. To prevent leakage of the fluid 20 from the seal chamber 19 along the shaft surface 22, the mechanical face seal 10 is mounted on the machine housing 18 and the shaft 12 and defines a seal radially therebetween to contain the fluid 20.

One specific use for the mechanical seal 10 of the invention is in boiler feed water applications in power plants, wherein the mechanical seal 10 may be used to seal the rotating shaft 12 of a pump by which the boiler feed water is being pumped. One unique problem associated with this application is that the process fluid 20 creates feed water conditions that can generate electrical type corrosion of the seal faces in previously known seal configurations. Such feed water may have a water chemistry which results in low conductivity, typically less than 2 uS (microsiemen). These conditions result in corrosion of conventional mechanical seal materials from which known seal rings are formed, which materials commonly can include silicon carbide (SiC) and tungsten carbide. The observed corrosion of the seal ring materials can be attributed to the electrically insulating properties associated with ultra-pure water chemistry of the process fluid 20. The damage commonly occurs at the outside diameter circumferential edges, drive slots, and high rotational velocity surfaces of the known seal rings and as such, the invention is primarily directed to the inboard seal rings 16 and 17 that are in direct contact with the process fluid 20.

The illustrated mechanical seal 10 includes an annular seal housing or cartridge 23 which mounts to the exterior face of the machine 18 and has an interior cavity 24 which opens axially through the center area of the seal housing 23. The interior seal cavity 24 opens sidewardly so as to be in fluid communication with the seal chamber 19 and thereby define an extension of the seal chamber 19.

The seal housing 23 further includes an outer wall 25, an end wall 26 which extends radially inwardly toward the shaft 12, and an inner wall 27 which is disposed proximate to but spaced radially from the outer shaft surface 22. The shaft 12 extends axially out of the seal chamber 19 and through the interior cavity 24 of the mechanical seal 10 whereby an exposed end section 30 of the shaft 12 projects outwardly past the end wall 26 for connection to a motor or other drive unit of the machine 14.

The outer and inner walls 25 and 27 which define an annular seal ring pocket 31 that opens axially toward the seal chamber 19. The seal ring pocket 31 is adapted to slidably receive the seal ring 17 therein, wherein the seal ring 17 is essentially concentric to the shaft 12.

The seal ring 17 serves as a primary ring of the mechanical seal 10, and includes a seal face 35 which extends radially between the outside and inside seal ring diameters 36 and 37. Thus, the outside diameter 36 is exposed to the liquid 20 being sealed within the chamber 24 while the inside diameter 37 is exposed to an exterior fluid. In a single seal configuration, a zero-leakage or low-leakage seal might be achieved without the use of support systems such as a system which provides a barrier gas. Accordingly, the exterior fluid for the illustrated seal typically could be exterior air which defines ambient air pressure. During normal operating conditions, the fluid 20 is at a higher pressure than the ambient air pressure. The seal rings 16 and 17 also might represent one inboard pair of seal rings which might be provided with an outboard pair of seal rings in a double seal configuration, wherein the exterior fluid is a barrier or buffer gas provided in a chamber formed between the inboard and outboard seal rings.

The stationary seal ring 17 is prevented from rotating relative to the seal housing 23 by drive pins which engage the outermost circumferential surface of seal ring 17, wherein stationary refers to the non-rotatability of the seal ring 17 relative to the rotatable shaft 12 and rotating seal ring 16. The stationary seal ring 17 is biased axially toward the other seal ring 16 by a plurality of circumferentially spaced apart springs 39 which project axially from the seal housing end wall 26 into the pocket 31. In particular, the outer end of each spring 39 abuts axially against an annular backing plate 40 on the back face of the seal ring 17 as illustrated in FIG. 1. The opposite inner end 41 of each spring 39 is seated in a corresponding bore 42 formed in the end wall 26. Alternate biasing members may be used besides springs.

To prevent migration of the fluid 20 along the circumferential and back faces of the seal ring 17, an O-ring 43 is provided in an annular groove 44 in the inner wall 27 to define a secondary seal. The O-ring 43 also acts to center the seal ring 17 relative to the shaft 12.

For assembly, a rigid retaining ring 46 is provided on the seal housing 23 to limit forward movement of the seal ring 17. The ring 46 confines the seal ring 17 within the housing 23.

To support the rotating seal ring 16 in sealing engagement with the stationary seal ring 17, a shaft sleeve 45 is non-rotatably connected to the shaft 12 so as to rotate in unison with the shaft 12. In particular, the shaft sleeve 45 has a generally tubular cross-section and has an annular end portion 47 which includes a backing flange 48 which projects radially outwardly from the shaft surface 22. The backing flange 48 includes an outer flange wall 49 which is drivingly engaged with the seal ring 16 so that the seal ring 16 rotates in unison with the shaft 12 and shaft sleeve 45.

During assembly, the sleeve 45 is slidably received on the periphery of the shaft 12 and is secured in place by additional equipment components disposed adjacent thereto. The fluid 20 is prevented from leaking between the shaft sleeve 45 and the shaft 12 by an O-ring 50 which defines a secondary seal between the inner face of the shaft sleeve 45 and the outer shaft surface 22. Additional secondary seals are provided between the sleeve 45 and seal ring 16.

When secured in place, the sleeve end portion 47 abuts a circumferential shoulder 51 formed on the shaft 12. The shoulder 51 has a face 52 which faces axially toward the end portion 47 wherein the backing flange 48 and flange wall 49 define a seal ring pocket 53 which receives the seal ring 16 therein.

As to the seal ring 16, the seal ring 16 defines a mating ring which sealingly mates with the primary ring 17. During assembly, the seal ring 16 is slid axially onto the shaft 12 and abuts against the backing flange 48. The shaft sleeve 45 is then slid onto the shaft 12 wherein the seal ring 16 is confined within the seal ring pocket 53.

Figure 2:
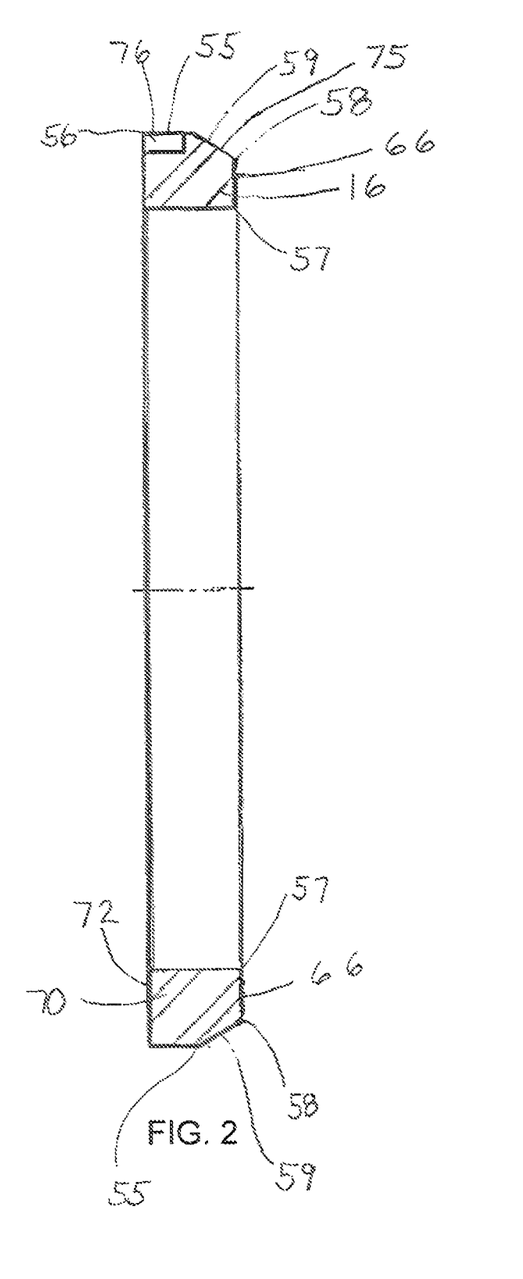
FIG. 2 is a side cross-sectional view of a representative seal ring.
Figure 3:
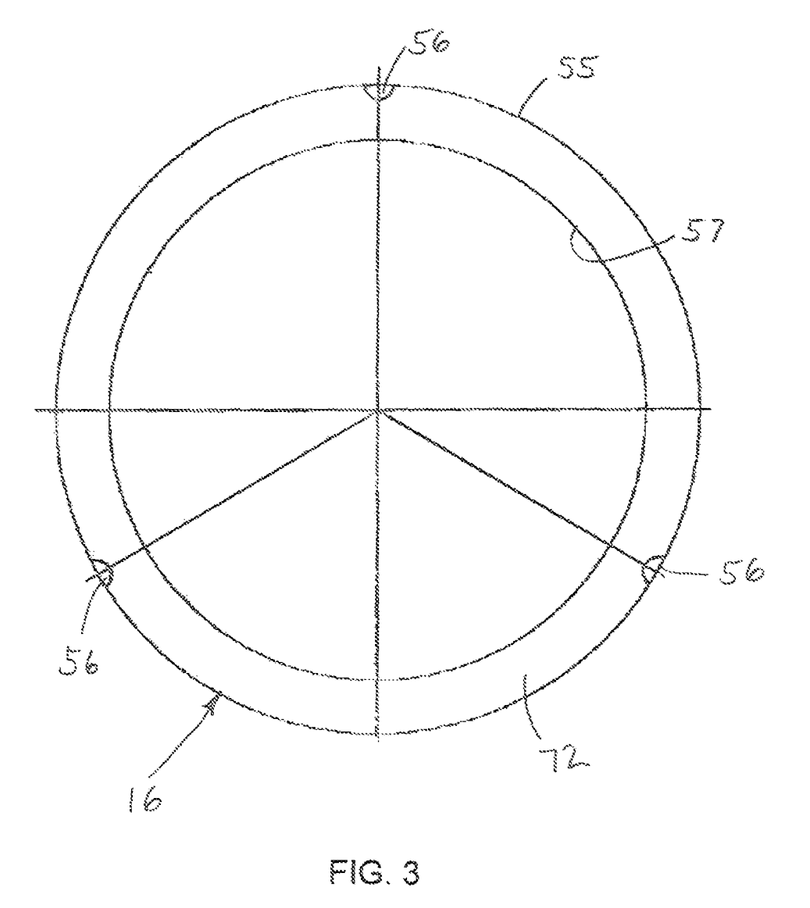
FIG. 3 is a plan view of a back side of the seal ring.

As seen in FIG. 2, the outer diameter 55 of the seal ring 16 includes drive notches 56 spaced equidistantly apart from each other. A drive member such as a pin engages radially between the flange wall 49 and each respective one of the drive notches 56 to prevent movement of the seal ring 16 relative to the shaft sleeve 45. As such, the seal ring 16 rotates in unison with the shaft sleeve 45 and shaft 12.

Referring to FIGS. 1-2, the seal ring 16 further includes an inner face diameter 57, and outer face diameter 58 and a seal face 66, which extends radially between the face diameters 57 and 58 and faces axially toward the opposing seal face 35 of the primary ring 17. The seal ring 16 also includes an angled ring surface 59 which extends between the outer face diameter 58 and the outer ring diameter 55.

With the above-described arrangement, the seal ring 17 is non-rotatably supported in the seal housing 23 while the opposing seal ring 16 is rotatably supported on the shaft 12 so as to rotate in unison therewith. When the shaft 12 is not rotating, the opposing seal faces 35 and 66 are disposed in contacting relation due to the biasing force of the springs 39 to prevent migration of the liquid being sealed radially inwardly across the sealing region which extends radially across these seal faces 35 and 66.

During shaft rotation, the resilient spring loading of the seal ring 17 permits the seal ring 17 to be displaced axially away from the seal face 66 further into the pocket 31. Therefore, during this shaft rotation, the seal faces 35 and 66 separate slightly whereby a fluid film is defined therebetween as will be described in further detail hereinafter. Even though seal face separation is permitted, the springs 39 continue to generate an axial closing force on the seal ring 17.

In order to eliminate leakage of the fluid 20 across the seal faces 35 and 66 even when the fluid film is generated therebetween, the mechanical seal 10 preferably is manufactured with a hydrodynamic face pattern. In particular, this might be a one of the face patterns disclosed in Published US Patent Application US 2012/0280456 A1 or U.S. Pat. No. 7,194,803, the disclosures of which are incorporated herein by reference in their entirety. The face pattern may be formed by the laser machining process disclosed in the U.S. '803 patent referenced above.

Figure 4:
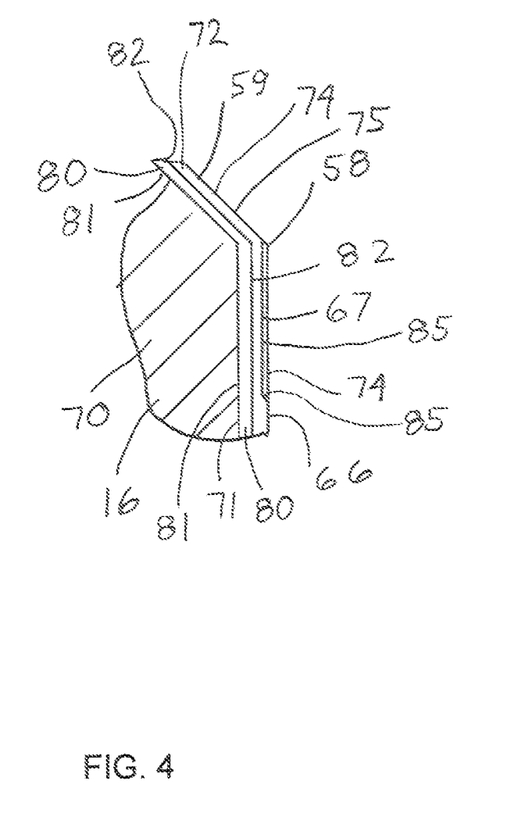
FIG. 4 is an enlarged partial cross-sectional view of the seal ring and seal face region thereof.

FIG. 4 generally shows a face pattern with shallow grooves or wavy face grooves 67 which are laser machined into the seal face 66 to a preferred depth. Preferably, the seal face pattern is applied to the seal face 66 of the rotating seal ring 16 since the silicon carbide serves as a suitable, durable material.

Considering the particular, destructive environments in which the seal 10 is to be used, the invention relates to a unique seal ring construction for the mechanical seal ring 16, wherein the silicon carbide (SiC) mechanical seal ring 16 is coated over critical exposed surfaces with a tantalum coating material. In this regard, the body 70 (FIGS. 2 and 4) of the seal ring 16 forms the major substrate for the seal ring 16. This seal ring 16 preferably is formed as a monolithic structure from SiC so that the silicon carbide essentially extends radially and uniformly from the outer ring diameter 55 to the inner ring diameter 57, and axially from the front ring face 71 to the back ring face 72. In a typical ring face, the ring face 71 would form an exposed face of a seal ring. However, in the inventive seal ring 16, the front ring face 71 essentially is coated by additional protective material forming an outer coating layer 72.

Preferably, the outer coating layer 72 is formed of tantalum that is applied to a desired thickness of tantalum material. This coating layer 72 defines an exposed coating surface 74 which covers the surfaces of the seal ring substrate that would be exposed to the process fluid 20. In the illustrated seal ring 16, the coating layer 72 is applied over the substrate 70 so that the exposed coating surface 74 defines the exposed seal face 66, the exposed surface 75 covering the angled ring surface 59 and the exposed surface 76 defining the outer diameter 55. This exposed coating surface 74 is subjected to the operating environment generated by exposure to the process fluid 20 during shaft rotation, wherein the tantalum coating surface 74 resists if not substantially eliminates electrical type corrosion.

The coating preferably is applied to at least some of the seal ring surfaces which are exposed to the process fluid 20 so as to at least minimize electrical corrosion. The tantalum is applied in an inventive method such that the tantalum is applied to a carbide, and preferably silicon carbide (SiC) seal ring 16 through chemical vapor deposition (CVD). The CVD process of applying the tantalum is conducted at an elevated temperature that adequately effects a reaction between the tantalum coating 72 and the SiC substrate 70 such that the tantalum and SiC materials form an intermediate transformation layer 80 (FIG. 4) of tantalum carbide which defines an intermediate boundary layer between the outer surface layer 72 of tantalum and the SiC substrate 70. The transformation layer 80 of tantalum carbide provides a strong bond between the tantalum layer 72 and SiC substrate 70.

The transformation layer 80 generally has an inner boundary 81 that forms at the interface with the substrate 70 and an outer boundary 82 that forms at the transition point between the intermediate tantalum carbide and the outer layer of tantalum.

The tantalum carbide forms during the CVD operation due to the CVD temperatures which are sufficiently hot so that the carbide from the SiC and the tantalum coating can react and form the tantalum carbide. This tantalum carbide provides a strong bond between the tantalum and silicon carbide on opposite outer and inner sides and this strong bond prevents separation or flaking off of the tantalum layer 72 during operation.

The coating layer 72 thereby has a defined thickness which is formed with a high degree of tantalum therein so that the coating layer 72 effectively acts as a tantalum material and provides substantial corrosion resistant benefits which can survive substantial run times with little if any electrical type corrosion. If desired, the outer tantalum layer 72 forming the exposed seal face 66 can then be machined, such as by the afore-mentioned laser machining, to form hydrodynamic face patterns including shallow grooves 67 which may be defined by various shapes including recessed waves known as a wavy face. The groove depth is set to less than the thickness of the tantalum coating layer 72 so that the depth of the face pattern does not extend into the intermediate transformation layer 80. As such, the interior groove surfaces 85 of the face pattern grooves 67 are still comprised of exposed tantalum. The grooves 67 therefore do not penetrate into this transformation layer 80.

It will be understood that the substrate 70 preferably defines unexposed ring surfaces in addition to said exposed ring surfaces described above, such that it is not necessary to coat the entire seal ring.

In a first aspect, the invention relates to the structure of a seal ring 16 formed of a SiC substrate 70, a tantalum carbide transformation layer 80, and a tantalum surface layer 72 wherein the tantalum carbide of layer 80 is formed during the application of the tantalum through CVD. In a second aspect, the invention relates to the method for forming this seal ring 16 through a CVD process which supplies tantalum to the SiC substrate 70 wherein the intermediate transformation layer 80 forms during the CVD process by reaction of the tantalum coating with the SiC substrate material.

Although a particular preferred embodiment of the invention has been disclosed in detail for illustrative purposes, it will be recognized that variations or modifications of the disclosed apparatus, including the rearrangement of parts, lie within the scope of the present invention.

I claim:

1. A mechanical seal ring comprising:
a seal ring exposed to a process fluid, said seal ring having exposed ring surfaces which are defined on an exterior of said seal ring so as to be exposed to said process fluid and said exposed ring surfaces including a seal face;
said seal ring comprising a silicon carbide substrate and a coating layer applied to said substrate so as to define said exposed ring surfaces, said coating layer consisting essentially of tantalum and being electrical corrosion resistant, said seal ring including a transformation layer interfacing inwardly with said substrate and outwardly with said coating layer, said transformation layer consisting essentially of tantalum carbide; and
said seal ring formed by using chemical vapor deposition to apply said tantalum of said coating layer to said substrate of said seal ring to form said coating layer, and performing said chemical vapor deposition at an elevated temperature adequate to effect a reaction between said silicon carbide of said substrate and said tantalum being applied to form said tantalum carbide of said transformation layer.

2. The mechanical seal ring according to claim 1, wherein an inner interface is defined between said transformation layer and said substrate on an inner side of said transformation layer and an outer interface is defined between said transformation layer and said coating on an outer side of said transformation layer wherein said inner interface transitions from said silicon carbide of said substrate to said tantalum carbide of said transformation layer and wherein said outer interface transitions from said tantalum carbide of said transformation layer to said tantalum of said coating layer.

3. The mechanical seal ring according to claim 1, wherein said coating layer is bonded to said substrate by said intermediate transformation layer.

4. The mechanical seal ring according to claim 1, wherein said coating layer includes a hydrodynamic face pattern formed by shallow grooves, said shallow grooves having a groove depth less than a thickness of said coating layer.

5. The mechanical seal ring according to claim 4, wherein exposed surfaces of said shallow grooves are formed by said tantalum of said coating layer.

6. The mechanical seal ring according to claim 1, wherein said exposed ring surfaces include a radial surface at a ring diameter of said seal ring.

7. The mechanical seal ring according to claim 1, wherein said substrate defines unexposed ring surfaces in addition to said exposed ring surfaces.

8. A mechanical seal for sealing a process fluid against fluid leakage along a rotatable shaft comprising:
a housing defining a seal chamber for receiving the process fluid therein;
a seal ring located within said seal chamber, said seal ring having exposed ring surfaces which are disposed within said seal chamber for exposure to the process fluid wherein said exposed ring surfaces comprise a seal face;
said seal ring comprising a silicon carbide substrate and a coating layer applied to said substrate so as to define said exposed ring surfaces, said coating layer consisting essentially of tantalum and being electrical corrosion resistant, said seal ring including a transformation layer interfacing inwardly with said substrate and outwardly with said coating layer, said transformation layer consisting essentially of tantalum carbide; and
said seal ring formed by using chemical vapor deposition to apply said tantalum of said coating layer to said substrate of said seal ring to form said coating layer, and performing said chemical vapor deposition at an elevated temperature adequate to effect a reaction between said silicon carbide of said substrate and said tantalum being applied to form said tantalum carbide of said transformation layer.

9. The mechanical seal according to claim 8, wherein an inner interface is defined between said transformation layer and said substrate on an inner side of said transformation layer and an outer interface is defined between said transformation layer and said coating on an outer side of said transformation layer wherein said inner interface transitions from said silicon carbide of said substrate to said tantalum carbide of said transformation layer and wherein said outer interface transitions from said tantalum carbide of said transformation layer to said tantalum of said coating layer.

10. The mechanical seal according to claim 8, wherein said coating layer is bonded to said substrate by said intermediate transformation layer.

11. The mechanical seal according to claim 8, wherein said coating layer includes a hydrodynamic face pattern formed by shallow grooves, said shallow grooves having a groove depth less than a thickness of said coating layer.

12. The mechanical seal according to claim 11, wherein exposed surfaces of said shallow grooves are formed by said tantalum of said coating layer.

13. The mechanical seal according to claim 8, wherein said exposed ring surfaces face axially relative to a shaft axis, and wherein said exposed ring surfaces include a radial surface at a ring diameter of the seal ring, and said radial surface faces radially.

14. The mechanical seal according to claim 13, wherein said substrate defines unexposed ring surfaces in addition to said exposed ring surfaces, wherein said unexposed ring surfaces are sealed from said seal chamber and sealed from exposure to the process fluid.

\* \* \* \* \*